United States Patent
Choi

(10) Patent No.: US 7,307,352 B2
(45) Date of Patent: Dec. 11, 2007

(54) SEMICONDUCTOR PACKAGE HAVING CHANGED SUBSTRATE DESIGN USING SPECIAL WIRE BONDING

(75) Inventor: Ki-won Choi, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/055,266

(22) Filed: Jan. 22, 2002

(65) Prior Publication Data

US 2002/0105077 A1  Aug. 8, 2002

(30) Foreign Application Priority Data

Feb. 7, 2001  (KR) .............................. 2001-5945

(51) Int. Cl.
*H01L 23/48* (2006.01)
*H01L 23/495* (2006.01)

(52) U.S. Cl. ............... 257/786; 257/676; 257/738; 257/773; 257/779; 257/784

(58) Field of Classification Search ......... 257/666, 257/668, 676, 678, 737–738, 778–780, 784, 257/786–787, 773; 438/112, 121, 123, 124
See application file for complete search history.

(56) References Cited

U.S. PATENT DOCUMENTS

| | | | |
|---|---|---|---|
| 4,912,603 A | 3/1990 | Seyama | |
| 5,148,265 A * | 9/1992 | Khandros et al. | 257/773 |
| 5,468,994 A * | 11/1995 | Pendse | 257/693 |
| 5,633,785 A * | 5/1997 | Parker et al. | 361/766 |
| 6,118,177 A * | 9/2000 | Lischner et al. | 257/706 |
| 6,160,705 A * | 12/2000 | Stearns et al. | 257/675 |
| 6,232,561 B1 * | 5/2001 | Schmidt et al. | 174/260 |
| 6,236,108 B1 * | 5/2001 | Sota et al. | 257/667 |
| 6,323,065 B1 * | 11/2001 | Karnezos | 438/124 |
| 6,420,789 B1 * | 7/2002 | Tay et al. | 257/780 |
| 6,445,077 B1 * | 9/2002 | Choi et al. | 257/738 |
| 6,445,594 B1 * | 9/2002 | Nakagawa et al. | 257/786 |
| 6,448,664 B1 * | 9/2002 | Tay et al. | 257/780 |
| 6,707,149 B2 * | 3/2004 | Smith | 257/723 |

* cited by examiner

*Primary Examiner*—Ori Nadav
(74) *Attorney, Agent, or Firm*—Marger Johnson & McCollom, P.C.

(57) ABSTRACT

A semiconductor package utilizing an existing substrate regardless of the change of the semiconductor chip design, and manufacturing method thereof are provided. The semiconductor package including an added wire bonding unit for connecting a redundant bond finger to an added bond finger, or an added wire bonding unit for connecting a redundant bond finger connected to a first printed circuit pattern to a redundant solder ball pad connected to a second printed circuit pattern.

10 Claims, 6 Drawing Sheets

SEMICONDUCTOR PACKAGE HAVING CHANGED SUBSTRATE DESIGN USING SPECIAL WIRE BONDING

This application relies for priority upon Korean Patent Application No. 2000-73031, filed on Dec. 4, 2000, the contents of which are herein incorporated by reference in their entirety.

BACKGROUND OF THE INVENTION

1. Field of the Invention

The present invention relates to a semiconductor package such as a ball grid array (BGA) package.

2. Description of the Related Art

Recently, electronic products, such as personal computers (PC), cellular phones, and camcorders, become smaller and require higher performance. As a result, a semiconductor package having small size, large capacity, and fast processing speed is also required. To meet this requirement, a semiconductor package has evolved from a conventional through-hole type package, such as a dual in-line package (DIP), into surface mounting type packages, such as a thin small out-line package (TSOP), a thin quad flat package (TQFP), and a ball grid array (BGA) package.

In the BGA package, an insulating substrate, which includes copper printed circuit patterns formed on an upper region or on upper and lower regions, is used for the semiconductor package instead of a conventional lead frame.

FIGS. 1 and 2 are sectional views of a conventional ball grid array (BGA) package. FIG. 1 is a sectional view of a conventional BGA package having a double layer substrate. Hereinafter, the structure of the BGA package according to its manufacturing process will be described. Referring to FIG. 1, a semiconductor chip 6 singularized from wafers is prepared by a wafer sawing process. Subsequently, a die attach process, that is, a step of attaching the semiconductor chip 6 to a substrate 10 using an adhesive 5, is performed.

Printed circuit patterns 14 formed of copper are disposed on upper and lower regions of the substrate 10 and are connected to each other through a micro-via hole 9 and are in turn connected to a solder ball 13 on a lower region of the substrate 10. Also, solder masks 1 and 11 are formed on the upper and lower regions of the substrate 10, respectively, for preventing a short circuit between the printed circuit patterns 14 and for easily bonding the solder ball 13. The inside of the substrate 10 is formed of plastic resin such as polyimide. A wire bonding process is performed on the substrate 10 to connect a bond pad (not shown) of the semiconductor chip 6 to each of bond fingers 2 and 3 of the substrate 10. Reference numerals 2 and 3 denote a bond finger connected to the solder ball and a bond finger connected to ground, respectively.

Subsequently, an encapsulation process for protecting the semiconductor chip 6 and a gold wire 4 from the external environment and shock is performed using an epoxy mold compound (EMC) as an encapsulant 7. Next, the solder ball 13 is attached to a solder ball pad 8 disposed under the substrate 10. Lastly, a strip-shaped unit BGA package is separated as an individual BGA package by a cutting process.

FIG. 2 is a sectional view of a conventional BGA package having a single layer substrate. Referring to FIG. 2, a printed circuit pattern 14 including a bond finger 2 on an insulating layer 12, such as polyimide, is formed only on a single surface of the substrate 10'. Thus, a solder ball pad 8 under the substrate 10' is formed by punching the insulating layer 12 of the substrate 10'. The other elements have the same structure as those of the BGA package using the double layer of FIG. 1. Reference numerals 4, 5, 6, 7, and 13 denote a gold wire formed by wire bonding, an adhesive, a semiconductor chip, an encapsulant, and a solder ball, respectively.

FIG. 3 is a plan view illustrating the problems of the BGA manufacturing process in accordance with the prior art. First, referring to FIG. 3, terms used in the description of the present invention will be defined as follows.

A bond pad 15 is formed on a semiconductor chip 6 to connect integrated internal circuits to an external area of the semiconductor chip 6 by wire bonding. A bond finger 2 is formed on a package substrate 10. The bond finger 2 is electrically connected to the bond pad 15 by a gold wire 4. A solder ball pad 8 is formed on the substrate 10 to attach solder balls, i.e., external connecting terminals, in a semiconductor package, such as a BGA package. Also, a copper printed circuit pattern 14 is disposed on upper and/or lower regions of the substrate 10. In the case of a BGA package having the single layer substrate, the printed circuit pattern 14 connects the solder ball pad 8 to the bond finger 2.

In general, if the design of the semiconductor chip 6 is changed slightly, the number of added bond pads 20 for performing a new function in the semiconductor chip 6 increases from one to three or four. Thus, in order to package the semiconductor chip 6, the design of the substrate 10, which is used as a frame material, must be changed as well. However, if the existing substrate can be used by utilizing a redundant bond finger 21 and a redundant solder ball pad 22 formed on the substrate 10 without changing the design of the substrate 10, manufacturing cost can be reduced and a conventional process parameter can be used.

FIG. 3 illustrates that, unlike wire-bonding the added bond pad 20 to the redundant bond finer 21, it is difficult to connect the redundant bond finger 21 to the redundant solder ball pad 22. More particularly, in case of the BGA package having the single layer substrate, because the redundant solder ball pad 22 is surrounded by another printed circuit pattern 14', it is nearly impossible for the redundant solder ball pad 22 to be connected to the redundant bond finger 21.

For these reasons, if the design of the semiconductor chip 6 is changed slightly, it is difficult to make connections between the added bond pad 20 and the redundant solder ball pad 22 using the existing substrate 10. Thus, in case of the single-layer substrate, the substrate design must be changed to a double-layer substrate with an additional micro-via hole formed therethrough. Also, in case of the multi-layer substrate, such as the double-layer substrate, the number of layers of the substrate must be increased with additional micro-via holes formed therethrough.

In this case, because there are the added costs of changing the design of the substrate and manufacturing of the semiconductor package, and because the substrate manufacturing process becomes more complicated, the overall BGA package manufacturing process becomes more difficult. Also, if the semiconductor package is manufactured using a newly changed substrate, many problems may occur due to defects caused by many problems typically occurring at the beginning of the manufacturing process.

SUMMARY OF THE INVENTION

A semiconductor package comprises a substrate including a redundant bond finger, an added bond finger connected to a redundant solder ball pad; a semiconductor chip having an added bond pad attached to the substrate; a normal wire bonding unit coupled between the added bond pad and the redundant bond finger; and an added wire bonding unit coupled between the redundant bond finger and the added bond finger.

With an embodiment of the present invention, the semiconductor package can be manufactured without changing the design of the package substrate using the added wire bonding unit coupled between the redundant bond finger and the added bond finger, even when semiconductor chip design is changed.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art. Also, additional wire bonding defined in the present invention includes wire bonding for connecting a bond finger to a solder ball pad on a substrate.

Figure 1:
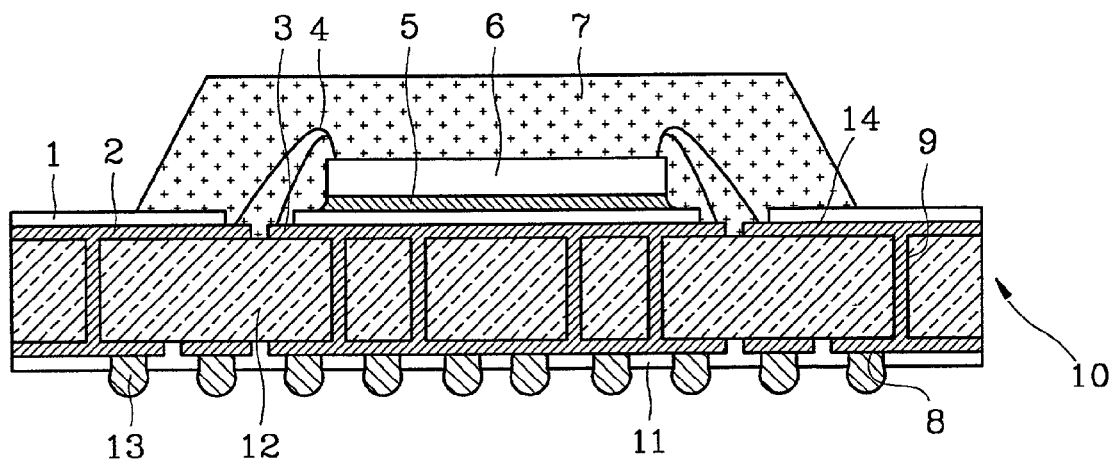
FIGS. 1 and 2 are sectional views of a conventional ball grid array (BGA) package.
Figure 2:
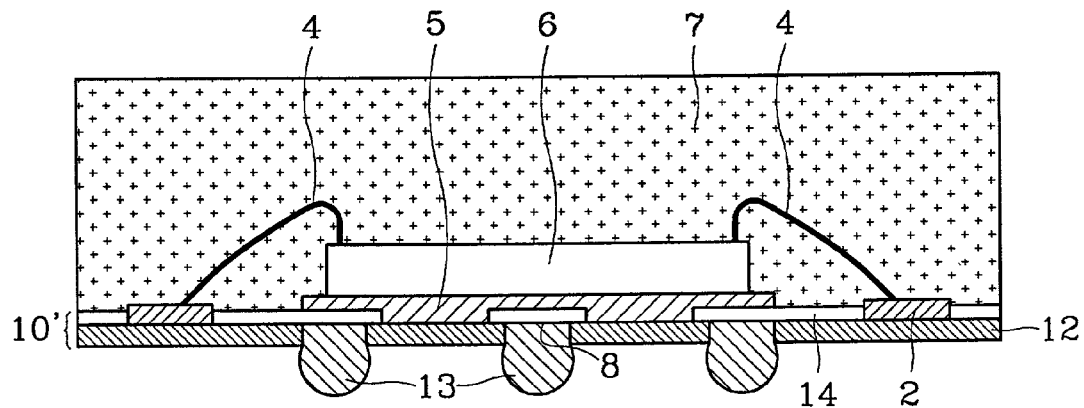
Figure 3:
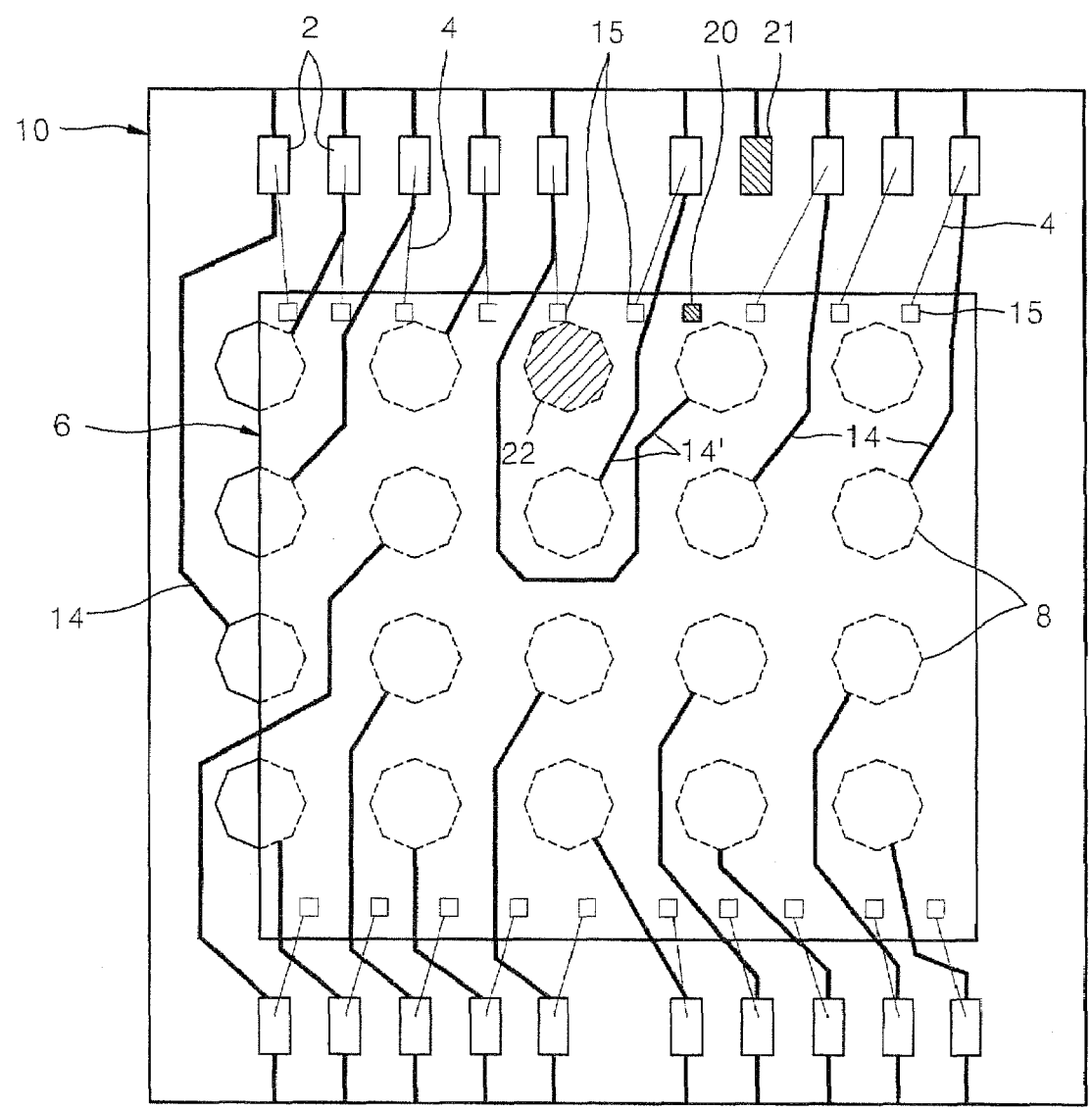
FIG. 3 is a plan view illustrating problems in a BGA package manufacturing process according to the prior art.
Figure 4:
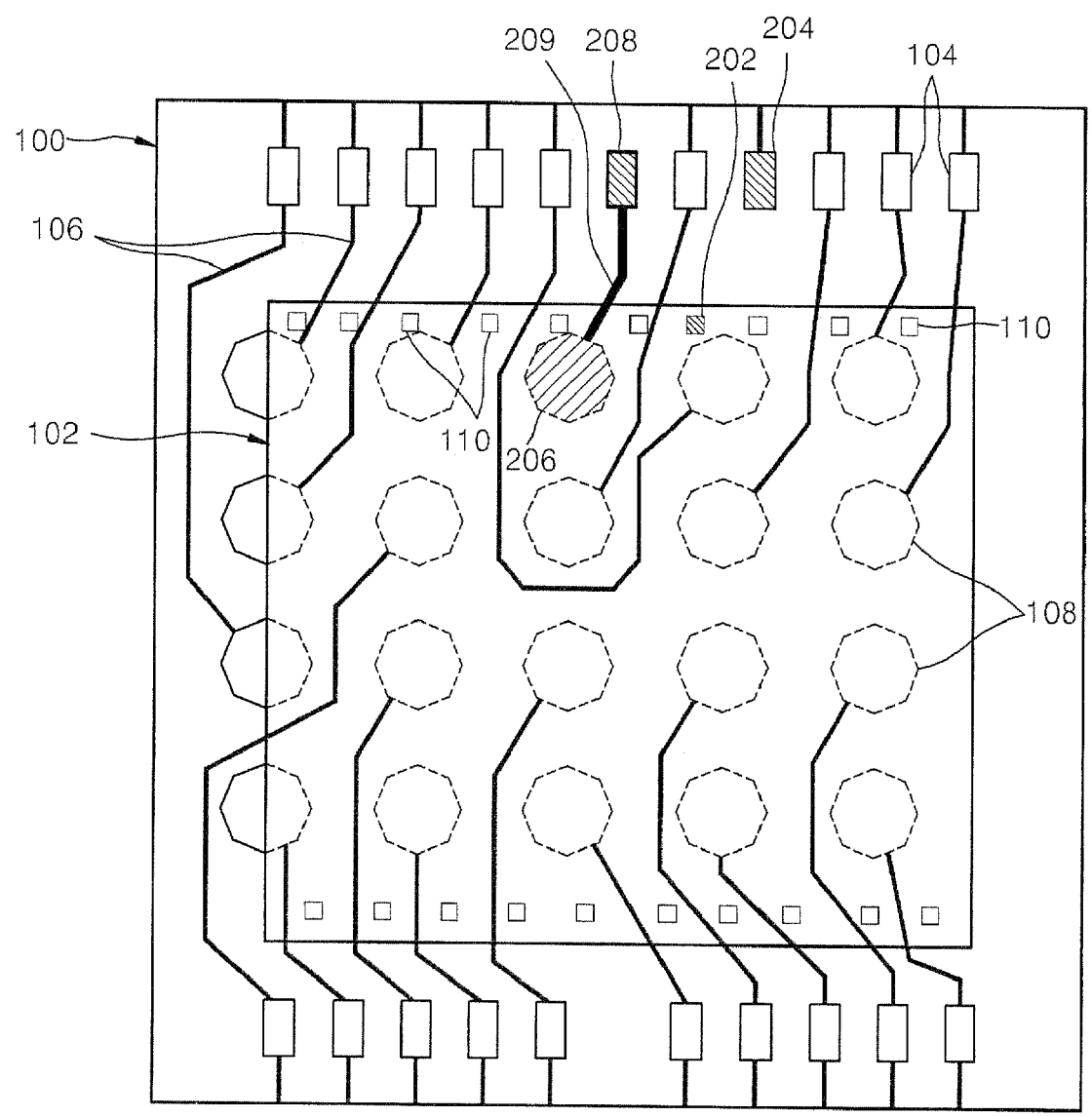
FIGS. 4 and 5 are plan views illustrating a semiconductor package and manufacturing method thereof according to a first embodiment of the present invention.
Figure 5:
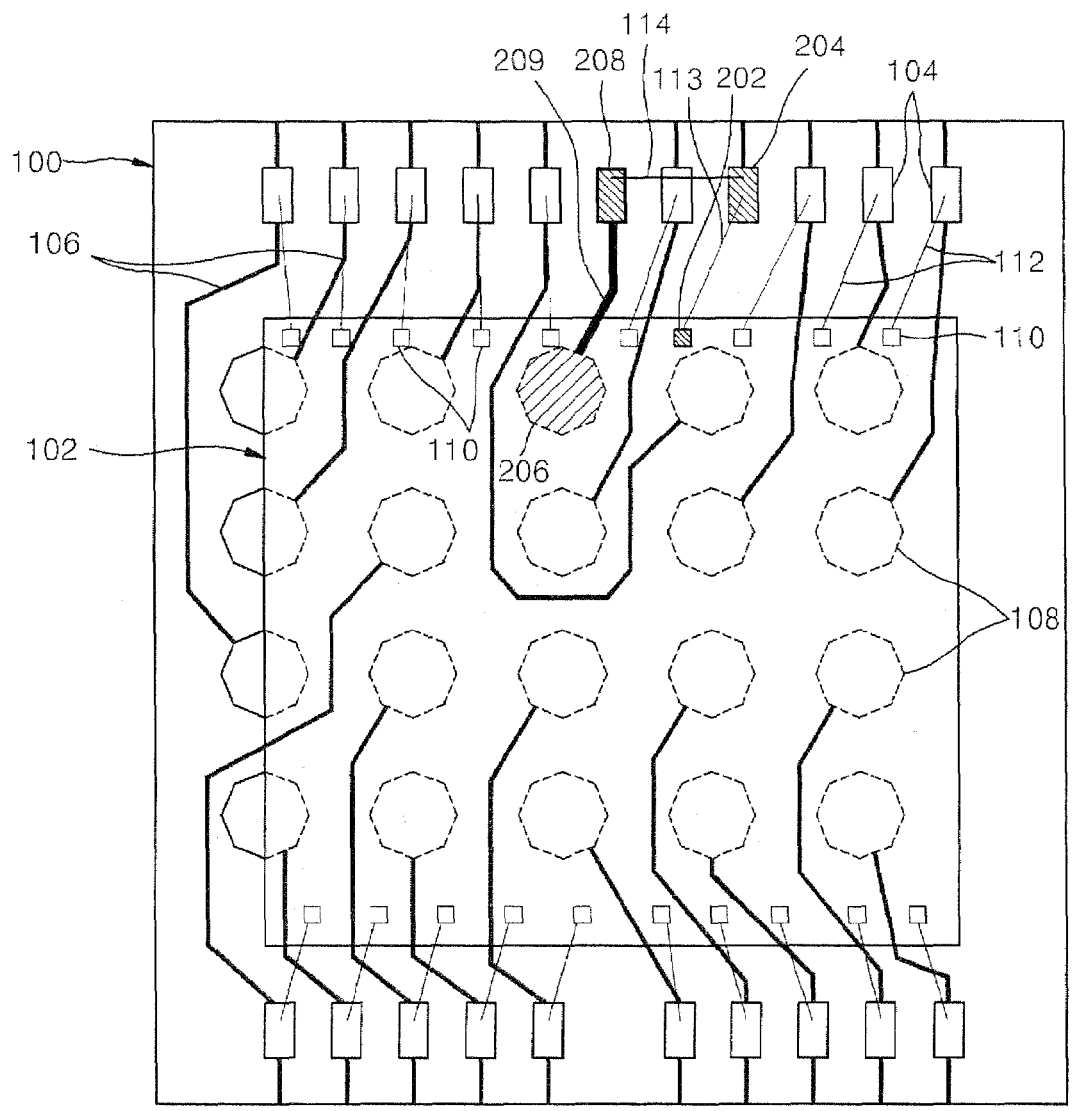
Figure 6:
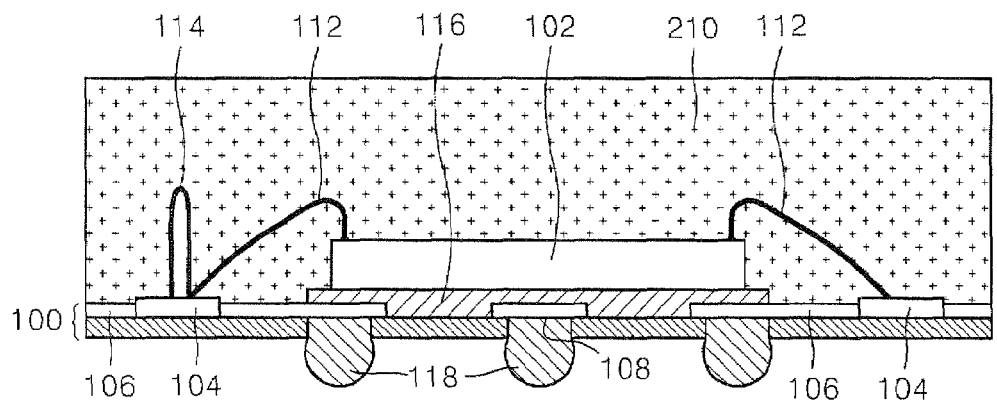
FIG. 6 is a sectional view of FIGS. 4 and 5.

FIGS. 4 and 5 are plan views illustrating a semiconductor package and manufacturing method thereof according to a first embodiment of the present invention, and FIG. 6 is a sectional view of the semiconductor package and manufacturing method of FIGS. 4 and 5. First, the configuration and the structural features of a semiconductor package according to the first embodiment of the present invention will be described with reference to FIG. 6.

The semiconductor package according to the first embodiment of the present invention includes a substrate 100 comprising a redundant bond finger 204, an added bond finger 208, and a redundant solder ball pad 206, a semiconductor chip 102 mounted on the substrate 100, a plurality of normal wire bonding units 112 one of which is a wire bonding unit 113 for connecting an added bond pad 202 to the redundant bond finger 204, an added wire bonding unit 114 that connects the redundant bond finger 204 to the added bond finger 208 that is in turn connected to the redundant solder ball pad 206 via printed circuit pattern 209, an encapsulant 210 for encapsulating the semiconductor chip 102, the normal wire bonding unit 112, and the added wire bonding unit 114, and a solder ball connected to the redundant solder ball pad under the substrate 100. A plurality of solder ball pads 108 are connected to bond fingers 104 in a printed circuit pattern 106. As used herein, the term "wire bond" means a wire that electrically connects one contact to another above the surface of substrate 100, e.g., like wire bonds 112, 114 in FIG. 6.

Normally wire bonding connects a bond finger to a bond pad. However, in the present invention, beyond this normal wire bonding, the added wire bonding unit 114 coupling a redundant bond finger to an added bond finger is included in the semiconductor package. With this, an added bond pad can be connected to a redundant solder ball pad without changing the substrate design. Detailed structure and functions will be described with reference to plan views illustrating a method for manufacturing a semiconductor package.

Hereinafter, the method for manufacturing a semiconductor package according to the first embodiment of the present invention will be described with reference to FIGS. 4 through 6.

Referring to FIG. 4, the added bond finger 208 for forming an added wire bonding unit is extended and formed on a substrate 100 that includes a redundant bond finger 204 and a redundant solder ball pad 206. The added bond finger 208 may be additionally formed when forming the substrate 100. Preferably, a solder mask is not formed on the surface of the added bond finger 208 so that wire bonding can be performed.

Referring to FIG. 5, a semiconductor chip 102 having a plurality of bond pads 110 and an added bond pad 202 is attached to a package substrate 100 using an adhesive 116, e.g., die attach paste, of FIG. 6. Subsequently, a normal wire bonding unit 112 is formed to connect the added bond pad 202 to the redundant bond finger 204 of the substrate 100. Also, an added wire bonding unit 114 is formed to connect the redundant bond finger 204 to the added bond finger 208.

Thus, the added bond pad 202 can be connected to a redundant solder ball pad 206 via the redundant bond finger 204, the added wire bonding unit 114, and the added bond finger 208. Thus, the substrate 100 can still be used by utilizing the added wire bonding unit 114 without changing the package substrate design, even if semiconductor chip design is changed slightly. Although only one added wire bonding unit 114 is shown in figures, a plurality of added wire bonding units may be formed as needed.

Thus, the semiconductor package can be manufactured without adding a micro-via hole to the substrate 100 regardless of whether the substrate 100 is a single-layer substrate, a double-layer substrate, or a multi-layer substrate. Therefore, a small-sized semiconductor package can be realized, and the cost to change the design of the substrate can be reduced.

Referring to FIG. 6, the resultant structure is encapsulated by using an encapsulant 210 such as an epoxy mold compound (EMC), and a solder ball 118 is attached to a lower surface of a substrate 100, and a strip-shaped semiconductor package is separated by a cutting process. Here, a normal wire bonding unit 112 and an added wire bonding unit 114 are encapsulated by the encapsulant 210.

Figure 7:
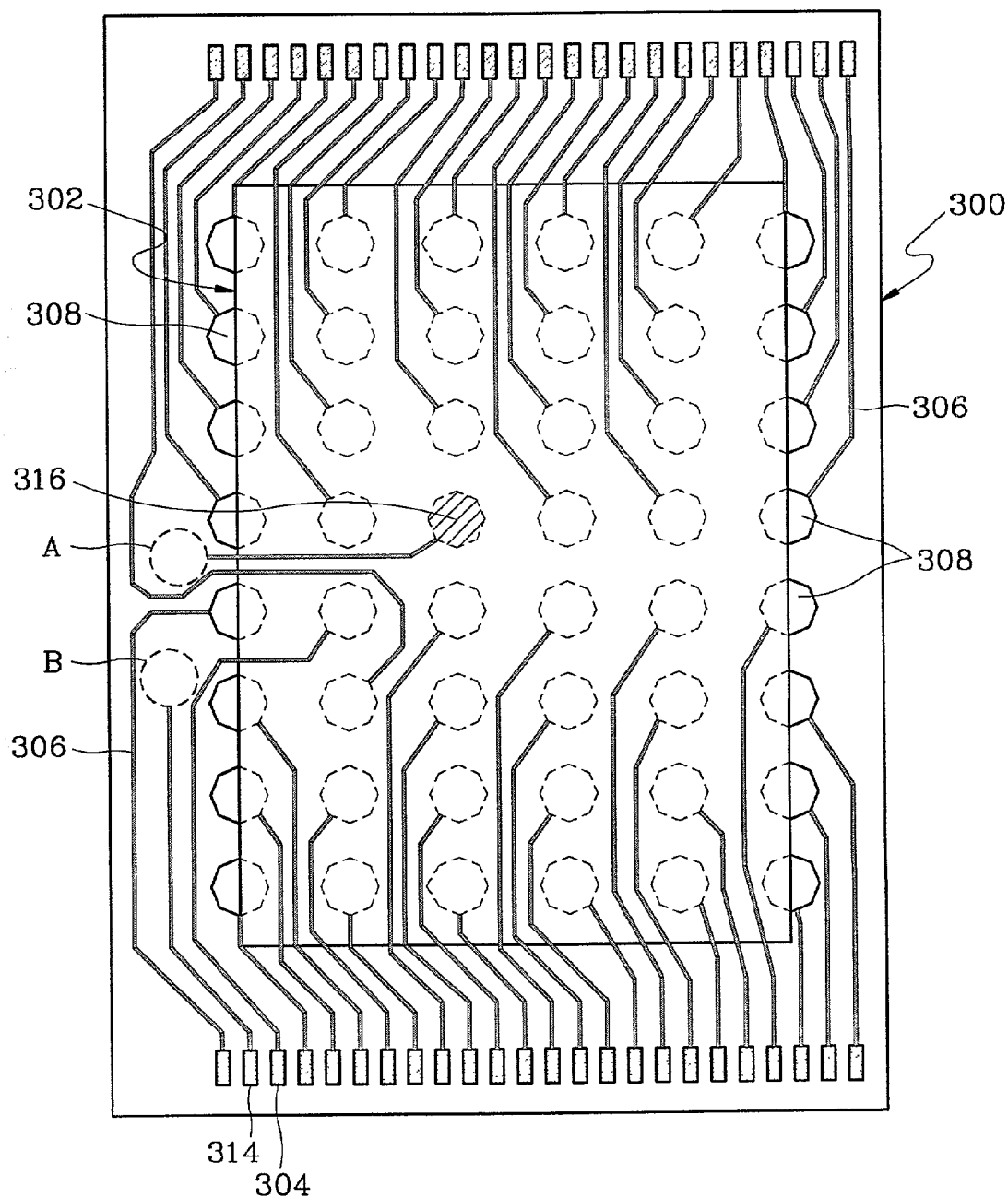
FIGS. 7 and 8 are plan views illustrating the semiconductor package and manufacturing method thereof according to a second embodiment of the present invention.
Figure 8:
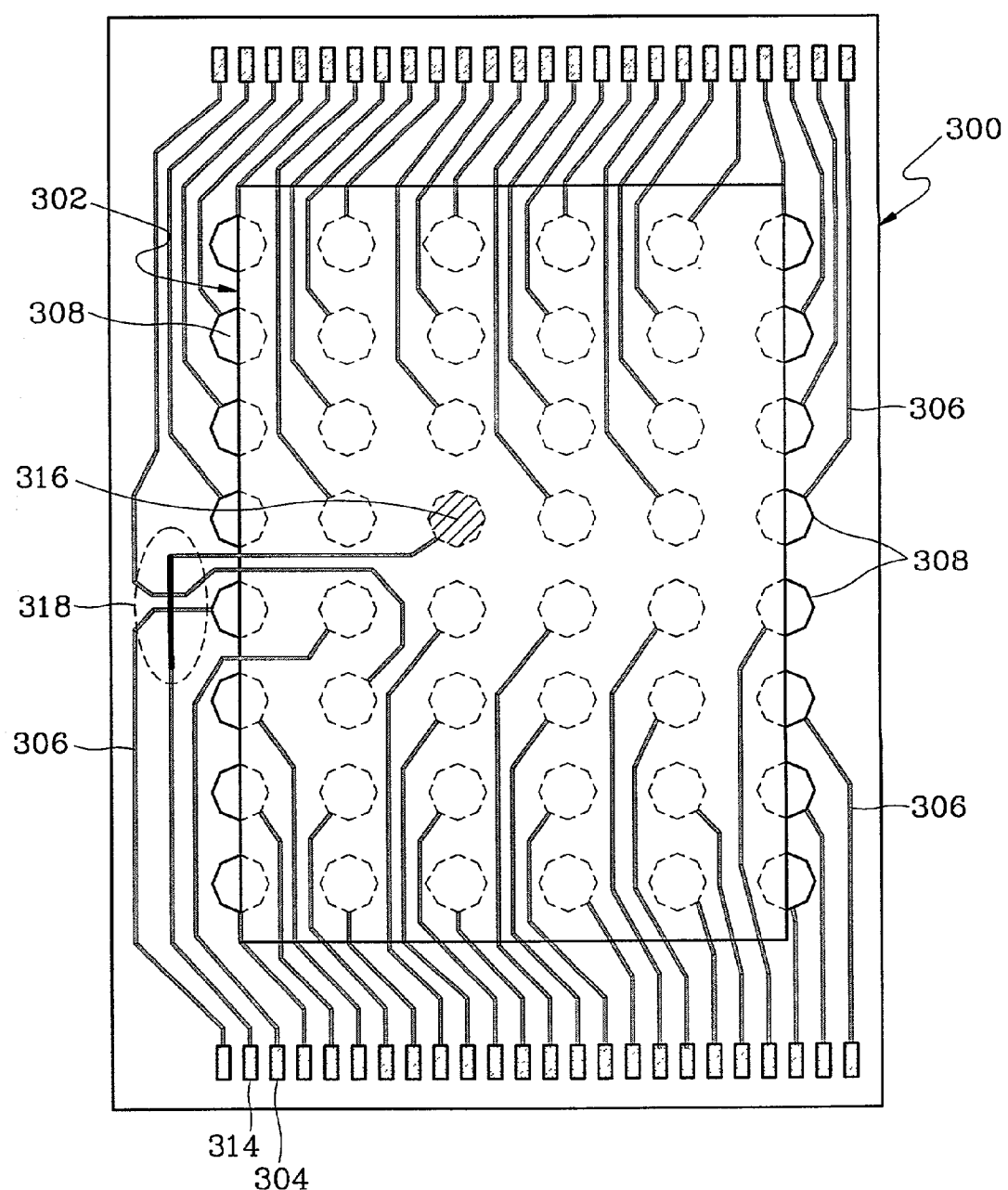

FIGS. 7 and 8 are plan views illustrating the semiconductor package and manufacturing method thereof according to a second embodiment of the present invention.

The second embodiment relates to a semiconductor package having an added wire bonding unit that connects printed circuit patterns, each having a width that enables wire bonding to be performed, by a gold wire, a manufacturing method thereof. The printed circuit patterns connect a redundant solder ball pad and a redundant bond finger.

Referring to FIG. 7, wire bonding is performed after a semiconductor chip 302 is attached to a substrate 300. If areas A and B need to be connected to each other via printed circuit patterns 306, a redundant solder ball pad 316 and a redundant bond finger 314 can be utilized. However, since areas A and B are surrounded by printed circuit patterns 306, it is impossible for areas A and B to be connected to each other via one of the printed circuit patterns 306. Reference numerals 304 and 308 denote a normal bond finger and a normal solder ball pad, respectively.

Referring to FIG. 8, an added wire bonding unit 318 connects areas A and B of FIG. 7. That is, the added wire bonding unit 318 connects a redundant solder ball pad 316 and a redundant bond finger 314. Thus, without using the printed circuit patterns 306 on a printed circuit board (PCB), the existing substrate can be used without changing the design of the substrate. The printed circuit patterns 306, on which the added wire bonding unit 318 is formed, have a width that enables wire bonding to be performed thereon. Thus, a stitch bond and a ball bond can be formed thereon. If the printed circuit patterns 306 have a width that enables the stitch bond and the ball bond to be formed, it is preferable to additionally form a pad, like the bond finger 304.

The first and second embodiments illustrate if the bond finger is formed on the outside of the solder ball pad 316. However, even if the bond finger is formed on an inner region inside the solder ball pad 316, the present invention can be applied.

As described above, according to the present invention, the semiconductor package can be manufactured without changing the design of the package substrate using the added wire bonding unit. First, the semiconductor package can be manufactured without changing the design of the substrate, i.e., by adding the micro-via hole to the substrate (regardless of whether the substrate is a single-layer substrate, or a multi-layer substrate), thereby realizing a small-sized semiconductor package having a thin thickness. Second, the cost to change the design of the substrate can be reduced, thereby reducing the manufacturing cost of the semiconductor package. Third, in case of using a changed substrate, defects caused by problems typically occurring at the beginning of a process can be prevented.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A semiconductor package comprising:
    a substrate having a plurality of first printed circuit bond fingers formed on the surface of the substrate;
    a semiconductor chip having a plurality of bond pads formed thereon;
    a plurality of first printed circuit solder ball pads formed on the surface of the substrate;
    a first printed circuit pattern formed on the surface of the substrate and electrically connecting each of a group of first printed circuit bond fingers and a corresponding first printed circuit solder ball pad;
    a wire bond electrically connecting each of the group of first printed circuit bond fingers and a corresponding bond pad thereby electrically connecting each of the corresponding bond pads to a first printed circuit solder ball pad;
    a second printed circuit bond finger formed on the surface of the substrate, there being no wire bond directly connected between the second printed circuit bond finger and any of the bond pads;
    a second printed circuit solder ball pad formed on the surface of the substrate;
    a second printed circuit pattern formed on the surface of the substrate and directly connecting the second printed circuit bond finger and the second printed circuit solder ball pad;
    a third printed circuit bond finger formed on the surface of the substrate, there being no printed circuit pattern directly connected to the third printed circuit bond finger;
    a first wire bond having one end affixed to the third printed circuit bond finger and the other end affixed to one of the bond pads; and
    a second wire bond directly connecting the second printed circuit bond finger and the third printed circuit bond finger thereby electrically connecting said one of the bond pads to said second printed circuit solder ball pad, the second printed circuit bond finger having no direct connections to any structure other than the second printed circuit solder ball pad and the third printed circuit bond finger.

2. The semiconductor package of claim 1, further comprising:
    an encapsulant for encapsulating the semiconductor chip and wire bonds.

3. The semiconductor package of claim 2, further comprising:
    a solder ball connected to said second printed circuit solder ball pad.

4. The semiconductor package of claim 1, wherein the substrate is a single-layer substrate on which the printed circuit pattern is formed.

5. The semiconductor package of claim 1, wherein the substrate is a double-layer substrate or a multi-layer substrate.

6. The semiconductor package of claim 1, wherein a solder mask is not formed on the second printed circuit bond finger.

7. The semiconductor package of claim 1, wherein the wire bonds are formed over the substrate.

8. The semiconductor package of claim 1, wherein the second wire bond electrically connecting the second printed circuit bond finger and the third printed circuit bond finger is formed on an outer region of the substrate on which the semiconductor chip is mounted.

9. The semiconductor package of claim 1, wherein the semiconductor chip is attached to the substrate using an adhesive.

10. The semiconductor package of claim 1, wherein the first printed circuit bond fingers have the same pad shape as that of the second printed circuit bond finger.

* * * * *